(12) United States Patent
Yamasaki et al.

(10) Patent No.: US 11,346,861 B2
(45) Date of Patent: May 31, 2022

(54) CONTACT ACCURACY ASSURANCE METHOD, CONTACT ACCURACY ASSURANCE MECHANISM, AND INSPECTION APPARATUS

(71) Applicant: TOKYO ELECTRON LIMITED, Tokyo (JP)

(72) Inventors: Yoshihito Yamasaki, Yamanashi (JP); Jun Mochizuki, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/970,880

(22) PCT Filed: Dec. 19, 2018

(86) PCT No.: PCT/JP2018/046776
§ 371 (c)(1),
(2) Date: Aug. 18, 2020

(87) PCT Pub. No.: WO2019/163275
PCT Pub. Date: Aug. 29, 2019

(65) Prior Publication Data
US 2020/0379012 A1    Dec. 3, 2020

(30) Foreign Application Priority Data
Feb. 23, 2018  (JP) .............................. JP2018-030761

(51) Int. Cl.
*G01R 1/04*        (2006.01)
*G01R 1/067*       (2006.01)
(Continued)

(52) U.S. Cl.
CPC ..... *G01R 1/07342* (2013.01); *G01R 31/2887* (2013.01); *G01R 31/2891* (2013.01)

(58) Field of Classification Search
CPC .......... G01R 1/04; G01R 1/067; G01R 1/073; G01R 31/02; G01R 31/26; G01R 31/27;
(Continued)

(56) References Cited

U.S. PATENT DOCUMENTS

2017/0219625 A1*  8/2017  Saiki .................. G01R 31/2891

FOREIGN PATENT DOCUMENTS

JP         2014-75420 A      4/2014

OTHER PUBLICATIONS

PCT International Search Report and Written Opinion, PCT Application No. PCT/JP2018/046776, dated Feb. 12, 2019 (with English translation of International Search Report), 9 pages.

* cited by examiner

*Primary Examiner* — Neel D Shah
(74) *Attorney, Agent, or Firm* — Fenwick & West LLP

(57) ABSTRACT

In a method for contact accuracy assurance in an inspection apparatus, an alignment substrate having first marks is placed and aligned on a stage, and a position checking member, which is a transparent body simulating a probe card and has second marks at positions corresponding to the first marks, is coupled to a mounting part where the probe card is to be coupled. Further, the alignment substrate is placed in a contact area directly below the position checking member. Horizontal deviations between the first and the second marks are detected by capturing images of the first and the second marks with position checking cameras provided above the position checking member at positions respectively corresponding to the second marks to capture the images from a top down angle. The contact accuracy between the substrate and probes of the probe card is assured when the deviations are within an allowable range.

5 Claims, 10 Drawing Sheets

(51) Int. Cl.
*G01R 1/073* (2006.01)
*G01R 31/26* (2020.01)
*G01R 31/27* (2006.01)
*G01N 27/04* (2006.01)
*G01N 27/22* (2006.01)
*G01R 31/28* (2006.01)

(58) Field of Classification Search
CPC .... G01R 31/28; G01R 31/2887; G01N 27/04; G01N 27/22
See application file for complete search history.

CONTACT ACCURACY ASSURANCE METHOD, CONTACT ACCURACY ASSURANCE MECHANISM, AND INSPECTION APPARATUS

TECHNICAL FIELD

The present disclosure relates to a contact accuracy assurance method and a contact accuracy assurance mechanism in an inspection apparatus for inspecting devices formed on a substrate, and the inspection apparatus using the same.

BACKGROUND

In a semiconductor device manufacturing process, an electrical inspection of a plurality of semiconductor devices (hereinafter, simply referred to as "devices") formed on a semiconductor wafer (hereinafter, simply referred to as "wafer") is performed upon the completion of all processes on the wafer. In general, an inspection apparatus for performing such an electrical inspection includes a probe card that is disposed to be opposite to a stage (chuck top) for attracting and holding the wafer and has probes to be in contact with the devices formed on the wafer. By pressurizing the wafer on the stage to the probe card, the contact probes of the probe card are brought into contact with electrodes of the devices, thereby performing the electrical inspection (electrical characteristic test) of the devices.

In order to efficiently perform the electrical inspection on a plurality of wafers, there is suggested an inspection system in which cells, each having a test head accommodating a tester and a prober unit including a probe card and a wafer chuck plate, are horizontally arranged in a row and the rows of the cells are arranged in multiple stages in a height direction (see, e.g., Patent Document 1).

In such an inspection system, a reference wafer that is an alignment substrate having a plurality of marks is used for maintenance. A coordinate system of the reference wafer is obtained from the marks by capturing an image of the reference wafer with an upper camera in an alignment area where the wafer is aligned. Next, an image of the probe card is captured by a lower camera in a contact area where electrode pads of the wafer and probes of the probe card are actually brought into contact with each other. A coordinate system of the probe card is obtained from the probes located at the positions corresponding to the marks on the reference wafer, and the alignment is performed by making the coordinate system of the reference wafer and coordinate system of the probe card coincide with each other.

Since, however, the alignment area and the contact area are separated from each other, the contact portions between the electrode pads of the reference wafer and the probes of the probe card may be misaligned due to, e.g., accuracy of a driving system, an influence of distortion, temperature changes, or the like.

Therefore, in the conventional case, the probes are actually made to be in contact with the reference wafer and, then, probe mark inspection (PMI) for inspecting needle marks on the electrode pads with a camera is performed to thereby assure the contact between the probes of the probe card and the electrode pads.

Patent Document 1: Japanese Patent Application Publication No. 2014-75420

The present disclosure provides a technique capable of assuring contact accuracy without consuming an alignment substrate.

SUMMARY

In accordance with an aspect of the present disclosure, there is provided a method for contact accuracy assurance in an inspection apparatus in which an inspection on a substrate that is an inspection target placed on a stage is performed with a tester by bringing the substrate into contact with a plurality of probes of a probe card, the method including: placing, on the stage, an alignment substrate having a plurality of first marks for position-alignment; aligning the alignment substrate on the stage; coupling a position checking member to a predetermined position of a mounting part where the probe card is to be coupled, the position checking member being a transparent body simulating the probe card and having a plurality of second marks for position-alignment at positions corresponding to the first marks of the alignment substrate; placing the alignment substrate at a predetermined position in a contact area directly below the position checking member; detecting horizontal deviations between the first marks and the second marks by capturing images of the first marks and the second marks with position checking cameras provided above the position checking member at positions respectively corresponding to the second marks to capture the images from a top down angle; and assuring contact accuracy between the substrate and the probes of the probe card when the deviations are within an allowable range.

In accordance with another aspect of the present disclosure, there is provided a contact accuracy assuring mechanism, in an inspection apparatus in which an inspection on a substrate that is an inspection target placed on a stage is performed with a tester by bringing the substrate into contact with a plurality of probes of a probe card, for assuring contact accuracy between the probes and the substrate by placing an alignment substrate having a plurality of first marks for alignment on the stage, the contact accuracy assuring mechanism including: a position checking member that is a transparent body simulating the probe card and coupled to a predetermined position of a mounting part where the probe card is to be coupled, the position checking member having a plurality of second marks for position-alignment at positions corresponding to the first marks of the alignment substrate; and position checking cameras provided above the position checking member at positions respectively corresponding to the second marks to capture images from a top down angle. Horizontal deviations between the second marks and the first marks are detected by capturing images of the second marks and the first marks with the position checking cameras in a state where the alignment substrate is aligned on the stage and, then, the alignment substrate is placed at a predetermined position in a contact area directly below the position checking member, and the contact accuracy between the substrate and the probes of the probe card is assured when the horizontal deviations are within an allowable range.

In accordance with still another aspect of the present disclosure, there is provided an inspection apparatus for inspecting a substrate that is an inspection target placed on a stage with a tester by bringing the substrate into contact with a plurality of probes of a probe card, the inspection apparatus including: a frame having a mounting part to which the probe card having the plurality of probes or a position checking member that is a transparent body simulating the probe card is coupled; the stage on which the substrate that is the inspection target or an alignment substrate is to be placed; an aligner configured to move the stage; a transfer mechanism configured to transfer the substrate or the alignment substrate onto the stage or transfer the probe card or the position checking member to the mounting part; a plurality of position checking cameras provided above the frame to capture images from a top down angle; and a controller configured to control the aligner, the transfer mechanism, and the position checking cameras. The alignment substrate has a plurality of first marks for position-alignment. The position checking member has a plurality of second marks for position-alignment at positions corresponding to the first marks of the alignment substrate. The position checking cameras are provided above the position checking member at positions respectively corresponding to the second marks. The controller detects horizontal deviations between the second marks and the first marks by capturing images of the second marks and the first marks with the position checking cameras in a state where the alignment substrate is placed on the stage and, then, placed at a predetermined position in a contact area directly below the position checking member, and assures contact accuracy between the substrate and the probes of the probe card when the horizontal deviations are within an allowable range.

Effect

In accordance with the present disclosure, it is possible to assure contact accuracy without consuming the alignment substrate.

DETAILED DESCRIPTION

Hereinafter, embodiments of the present disclosure will be described with reference to the accompanying drawings.
<Configuration of Inspection System>
(Outline of Overall Configuration)

First, an outline of an overall configuration of an inspection system to which a contact accuracy assurance method of the present disclosure is applied will be described.

Figure 1:
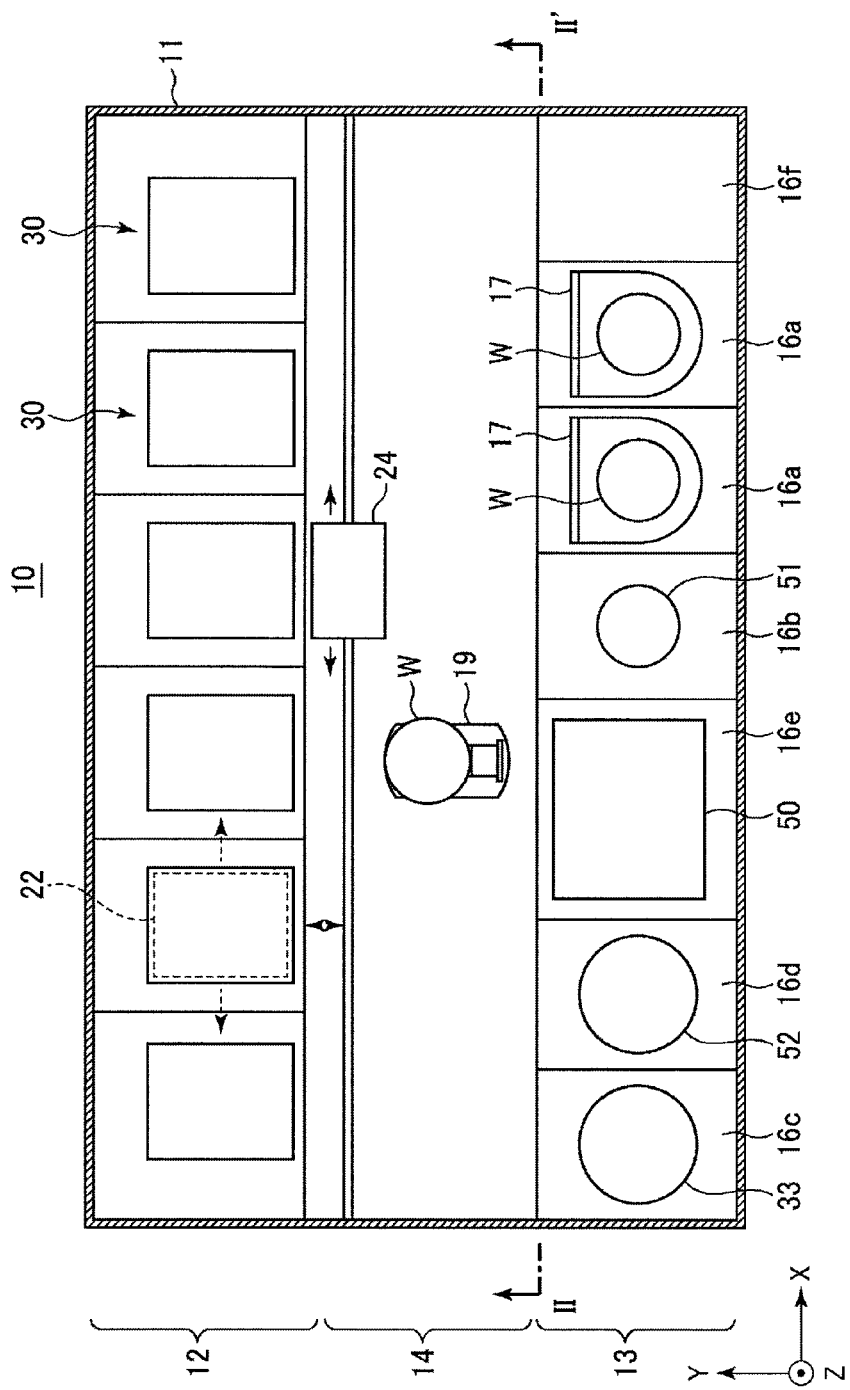
FIG. 1 is a horizontal cross-sectional view schematically showing an exemplary configuration of an inspection system.
Figure 2:
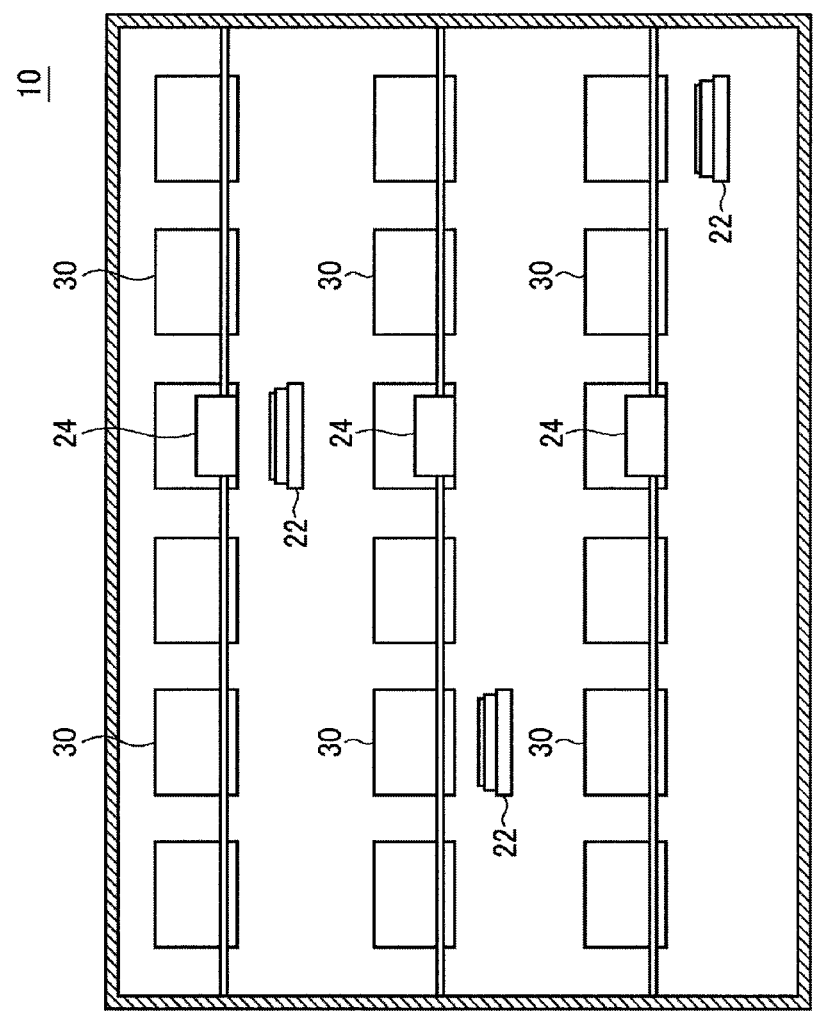
FIG. 2 is a cross-sectional view taken along a line II-II' of the inspection system in FIG. 1.

FIG. 1 is a horizontal cross-sectional view schematically showing an exemplary configuration of an inspection system. FIG. 2 is a cross-sectional view taken along a line II-II' of an inspection system of FIG. 1. An inspection system 10 of the present embodiment tests electrical characteristics of a plurality of devices formed on a wafer that is an inspection target.

In FIG. 1, the inspection system 10 includes a housing 11. The housing 11 has a testing area 12 for testing electrical characteristics of the semiconductor devices of the wafer W, a loading/unloading area 13 for loading and unloading the wafer W or the probe card into and from the testing area 12 and having a control system, and a transfer area 14 formed between the testing area 12 and the loading/unloading area 13.

As shown in FIG. 2, in the testing area 12, a plurality of (six in FIG. 2) inspection apparatuses (cells) 30, each having therein a tester for wafer inspection, is arranged along the X-direction in a row, and rows of the cells are arranged in three stages in the Z-direction (vertical direction).

In each stage, a single aligner (stage) 22 is disposed below the inspection apparatuses 30 arranged in the X direction to be movable in the X direction. Further, for each stage of the testing area 12, a single upper camera 24 for alignment is disposed to face the testing area side of each inspection apparatus 30 and movable along the X direction.

The loading/unloading area 13 is divided into a plurality of ports. Installed in the ports are wafer loading/unloading ports 16a, a reference wafer loader 16b, a probe card loader 16c, a position checking member loader 16d, a control port 16e, and a pre-alignment unit 16f. Each of the wafer loading/unloading ports 16a is configured to receive a FOUP 17 that is a container accommodating a plurality of wafers W. The reference wafer loader 16b, the probe card loader 16c, and the position checking member loader 16d is configured to receive a reference wafer 51 (alignment substrate), a probe card 33, and a position checking member 52, respectively. The control port 16d is configured to receive a controller 50 for controlling operations of the individual components of the inspection system 10. The pre-alignment unit 16f is configured to perform position-alignment of the wafer to be transferred.

In the transfer area 14, a transfer mechanism 19 that is movable in all directions is disposed. The transfer mechanism 19 transfers the wafer W from the wafer loading/unloading port 16a in the loading/unloading area 13 to the chuck top (stage) for attracting and holding the wafer in each inspection apparatus 30. Further, the transfer mechanism 19 transfers the wafer W having devices whose electrical characteristics have been tested from the chuck top of the corresponding inspection apparatus 30 to the wafer loading/unloading port 16a. The transfer mechanism 19 also transfers a probe card requiring maintenance from each inspection apparatus 30 to the probe card loader 16c and transfers a new probe card or a probe card whose maintenance has been completed to each inspection apparatus 30. Furthermore, the transfer mechanism 19 transfers the reference wafer 51 and the position checking member 52 to the inspection apparatus 30 that is a maintenance target at the time of performing the maintenance of the inspection apparatus 30.

(Inspection Apparatus at the Time of Inspection)

Figure 3:
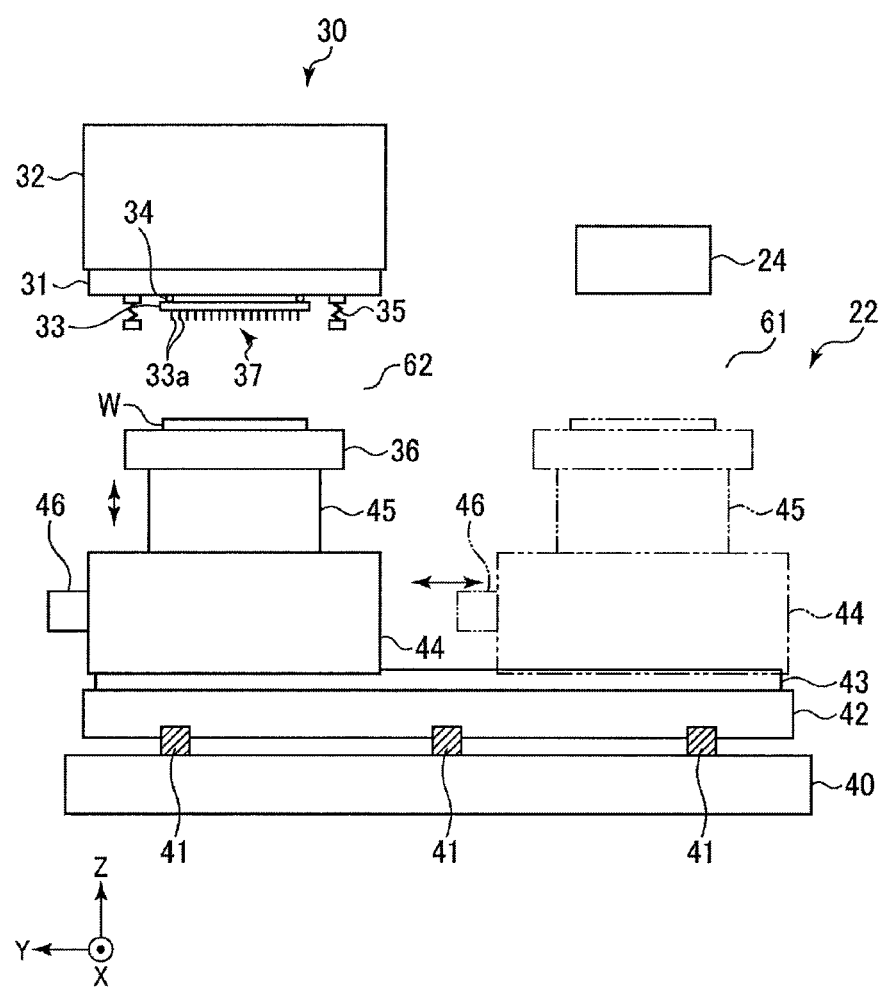
FIG. 3 shows a schematic configuration of an inspection apparatus at the time of inspection.

FIG. 3 shows a schematic configuration of the inspection apparatus 30 at the time of inspection. The inspection apparatus 30 at the time of inspection includes a frame 31 serving as a base, and a tester 32 is mounted on a top surface of the frame 31. The probe card 33 is coupled to a mounting part 37 on a bottom surface of the frame 31 by vacuum attraction force with a sealing member 34 interposed therebetween while being aligned to a predetermined position. The probe card 33 has a plurality of probes 33a to be in contact with electrodes of devices formed on the wafer W.

The tester 32 is formed by accommodating, in a housing, a plurality of boards on which a plurality of large scale integrations (LSIs) for performing a test is mounted. A contact block (not shown) is disposed between the tester 32 and the probe card 33 to connect the tester 32 and the probe card 33.

Further, the inspection apparatus 30 includes a chuck top 36 for attracting and holding the wafer W. The chuck top 36 can be moved and aligned by the aligner 22. A bellows 35 that is suspended downward to surround the mounting part of the probe card 33 is attached to the frame 31. The bellows 35 is provided to form a sealed space including the probe card 33 and the wafer W in a state where the wafer W on the chuck top 36 is in contact with the probes 33a of the probe card 33.

The aligner 22 in each stage includes an X block 42, a Y block 44, and a Z block 45. The X block 42 moves in the X direction on a guide rail 41 that is disposed on a base plate 40 of a cell row of the stage where the aligner 22 is disposed. The Y block 44 moves in the Y direction on a guide rail 43 that is disposed on the X block 42 to extend along the Y direction. The Z block 45 moves in the Z direction with respect to the Y block 44. The chuck top 36 is coupled to the Z block 45 while maintaining a predetermined positional relationship. A lower camera 46 for capturing an image of the bottom surface of the probe card 33 is disposed on a circumferential wall of the Y block 44.

The aligner 22 can move in the X direction to access a position corresponding to each inspection apparatus 30. Further, the aligner 22 can move the chuck top 36 between an alignment area 61 and a contact area 62 by moving the Y block 44 in the Y direction at the position corresponding to each inspection apparatus 30.

The alignment area 61 is formed directly below the upper camera 24. In a state where the chuck top 36 is located in the alignment area 61 by the aligner 22, the wafer W is transferred to and from the chuck top 36 by the transfer mechanism 19 and position-aligned using the upper camera 24.

The contact area 62 is formed directly below the probe card 33. When the chuck top 36 is moved from the alignment area 61 to the contact area 62 by the aligner 22, the lower camera 46 captures an image of the probe card 33 to perform a horizontal position-alignment of the wafer W in the contact area 62.

In order to bring the wafer W into contact with the probes 33a of the probe card 33, the Z block 45 of the aligner 22 is raised. Accordingly, the probes 33a of the probe card 33 are brought into contact with the electrode pads of the devices formed on the wafer W.

Figure 4:
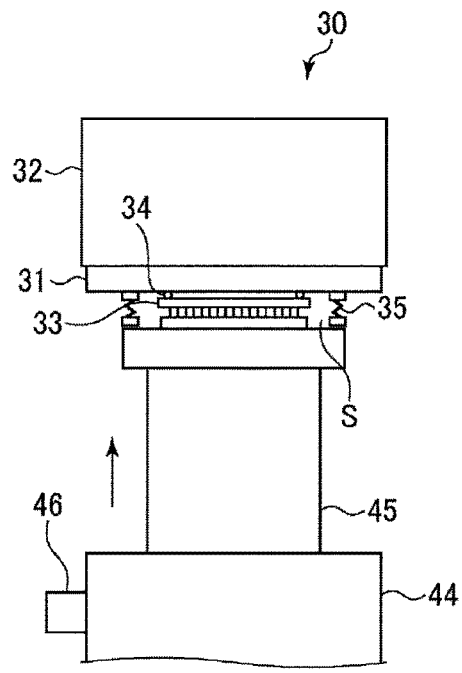
FIG. 4 shows a state in which a wafer is in contact with probes of a probe card in the inspection apparatus.

At this time, as shown in FIG. 4, in a state where the wafer W on the chuck top 36 is brought into contact with the probes 33a of the probe card 33, a sealed space S including the probe card 33 and the wafer W is formed by the bellows 35. Then, a vacuum attraction force is applied to the sealed space S through a vacuum line (not shown). Accordingly, the chuck top 36 is coupled to the frame 31 by vacuum attraction force.

Figure 5:
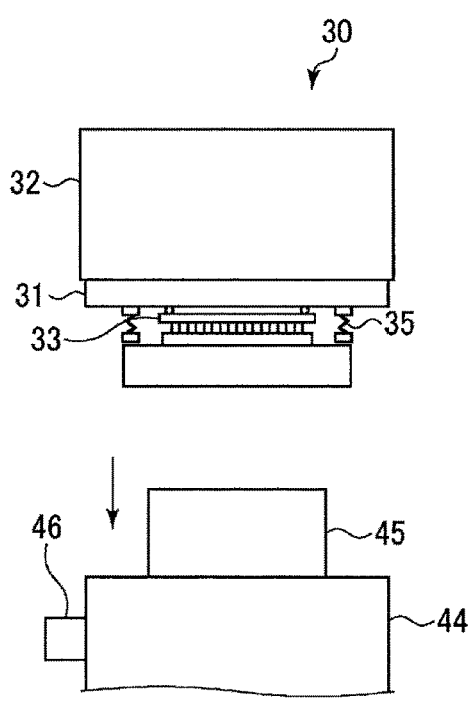
FIG. 5 shows a state in which a Z block of an aligner is lowered after the wafer is in contact with the probes of the probe card in the inspection apparatus.

In this state, the testing of the electrical characteristics of the wafer W using the tester 32 is initiated. Then, as shown in FIG. 5, the Z block 45 of the aligner 22 is lowered, and the aligner 22 is moved to another inspection apparatus 30. Then, the tested wafer W is unloaded. That is, the vacuum attraction of the chuck top 36 holding the tested wafer W is released, and the chuck top 36 is lowered by the aligner 22. Further, the chuck top is moved to the alignment area 61. Then, the tested wafer W on the chuck top 36 is returned to the FOUP 17 by the transfer mechanism 19.

<Inspection Apparatus at the Time of Maintenance>

Figure 6:
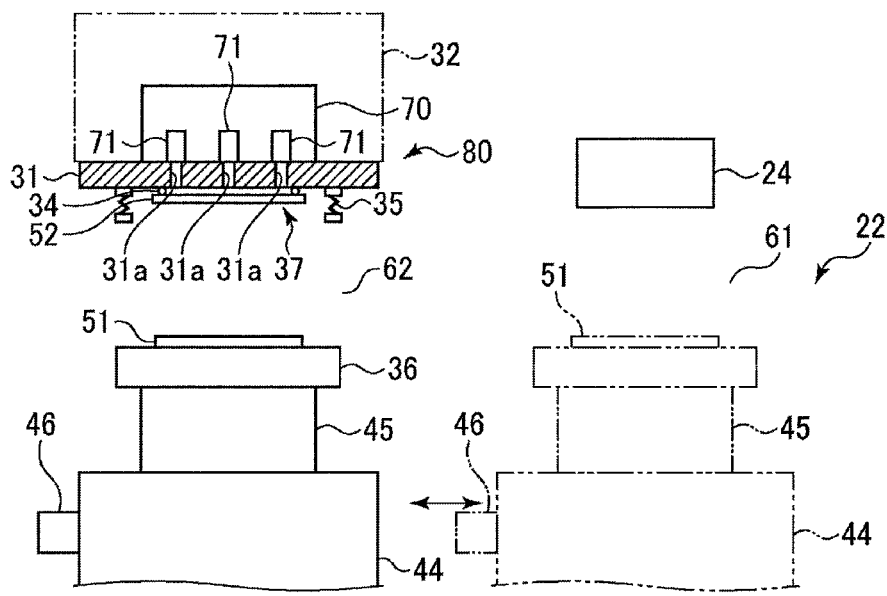
FIG. 6 shows a schematic configuration of an inspection apparatus at the time of maintenance.

FIG. 6 shows a schematic configuration of the inspection apparatus 30 at the time of maintenance. In the inspection apparatus 30 at the time of maintenance, a camera unit 70 is disposed at a predetermined position on the top surface of the frame 31. The position checking member 52 is coupled to the mounting part 37 on the bottom surface of the frame 31 by vacuum attraction force with the sealing member interposed therebetween while being aligned to a predetermined position. The camera unit 70 and the position checking member 52 constitute a contact accuracy assurance mechanism 80 that assures contact accuracy. Further, the reference wafer 51 that is an alignment substrate is attracted and held on the chuck top 36.

Figure 7:
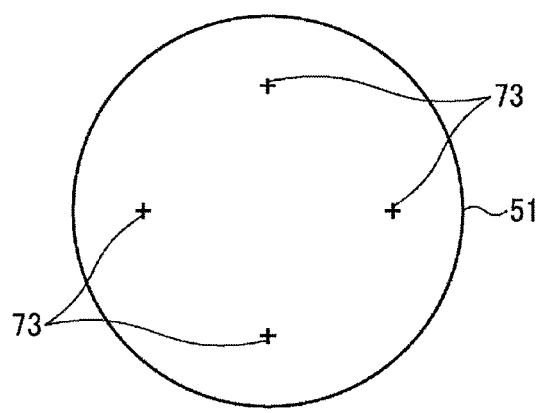
FIG. 7 is a plan view of a reference wafer.

As shown in FIG. 7, the reference wafer 51 has a plurality of (four in FIG. 7) first marks 73, similarly to the conventional reference wafer. The image of the reference wafer 51 is captured by the upper camera 24 in the alignment area 61, and the coordinate system of the horizontal plane of the reference wafer 51 is obtained from the first marks 73. However, it is not necessary for the reference wafer 51 to have alignment marks dedicated only for alignment, and a portion of a pattern already formed on the reference wafer 51 may be used as alignment marks. In this example, the reference wafer 51 is an alignment jig. However, the present disclosure is not limited thereto, and a typical wafer may be used.

Figure 8:
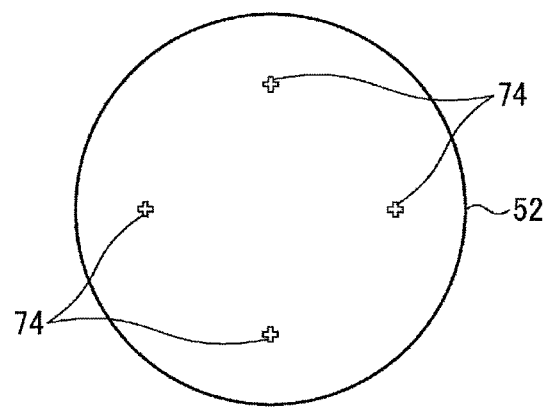
FIG. 8 is a plan view of a position checking member.

The position checking member 52 simulates the probe card 33 and is made of a transparent material such as glass. As shown in FIG. 8, second marks 74 are formed at positions corresponding to the first marks 73 of the reference wafer 51. The alignment marks are also formed on the probe card 33. The second marks 74 of the position checking member 52 are formed at the same positions as those of the marks of the probe card 33, and the position checking member 52 is coupled to the mounting part 37 in the same manner as the probe card 33. Then, the coordinate system of the horizontal plane of the position checking member is obtained by capturing images of the second marks 74 with the lower camera 46.

Then, the controller 50 performs the position alignment between the position checking member 52 and the reference wafer 51 such that the coordinate system of the position checking member 52 and the coordinate system of the reference wafer 51 coincide with each other.

Figure 9:
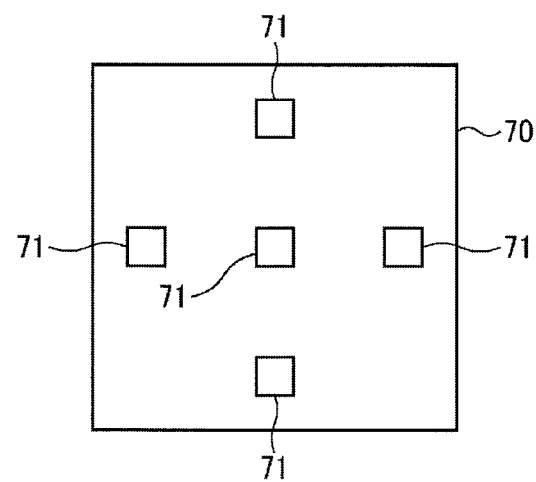
FIG. 9 is a plan view of a camera unit.

The camera unit 70 is installed in the tester 32. However, the camera unit 70 that is configured to be movable may be mounted on the frame 31 after the tester 32 is retracted by an appropriate driving mechanism. As shown in FIG. 9, for example, the camera unit 70 includes five position checking cameras 71, each of which captures an image from a top down angle. In the example of FIG. 9, one position checking camera 71 is disposed at the central portion and four position checking cameras 71 are disposed at the peripheral portions around the central portion. The four position checking cameras 71 disposed at the peripheral portions are located at positions corresponding to the four first marks 73 of the reference wafer 51. The position checking camera 71 disposed at the central portion is used for mechanical origin checking, and is not required when the virtual origin is acceptable. The number of position checking cameras 71 is not limited thereto and may be two or more. As the number of position checking cameras 71 increases, the accuracy becomes higher. The frame 31 has holes 31a formed at positions corresponding to the position checking cameras 71.

Contact accuracy is assured by detecting the horizontal deviation between the second marks 74 of the position checking member 52 and the first marks 73 of the reference wafer 51 and checking that the deviation is within an allowable range. The deviation is detected by moving the reference wafer 51 to a predetermined contact area 62 using the aligner 22, aligning the reference wafer 51 to a predetermined plane position, and capturing images of the position checking member 52 and the reference wafer 51 disposed therebelow with the position checking camera 71.

(Controller)

Figure 10:
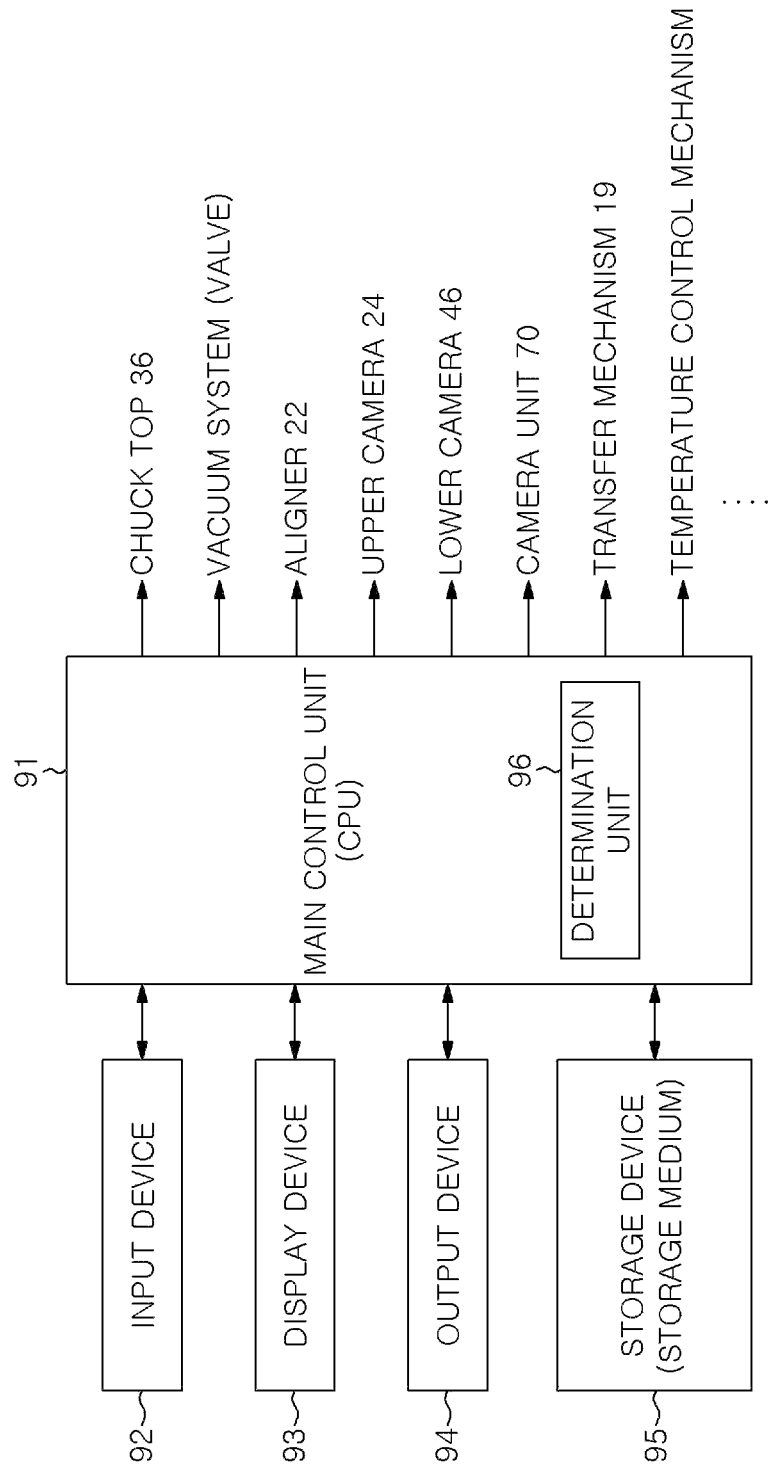
FIG. 10 is a block diagram of a controller.

As shown in FIG. 10, the controller 50 includes a main control unit 91 configured to control the individual components of the inspection system 10, an input device 92 configured to input information, a display device 93 configured to display information, an output device 94 configured to output information, and a storage device (server) 95 configured to store information.

The main control unit 91 has a CPU and controls the chuck top 36, the vacuum system (valve or the like) used for attracting and holding the wafer W, the aligner 22, the upper camera 24, the lower camera 46, the camera unit 70, the transfer mechanism 19, the temperature control mechanism in the chuck top 36, and the like. Further, the main control unit 91 performs calculation required for alignment or the like. The main control unit 91 further includes a determination unit 96 for determining whether or not the reference wafer 51 and the position checking member 52 are misaligned.

The storage device 95 has a built-in storage medium such as a hard disk in which data for control is stored. Further, a portable storage medium such as a CD, a DVD, a flash memory, or the like in which data for control is stored may be set to the storage device 95. The storage medium is configured to store, for example, a recipe for controlling the operation of the inspection apparatus, data for performing the operation of the inspection apparatus, and the like.

The main control unit 91 of the controller 50 causes the inspection system 10 to perform a predetermined operation based on, e.g., a processing recipe stored in a storage medium built in the storage device 95 or a storage medium set to the storage device.

<Operation of the Inspection System>

Next, the operation of the inspection system 10 configured as described above will be described. The following operation is controlled by the controller 50.

(Operation at the Time of Inspection)

At the time of the inspection using the inspection apparatus 30, the probe card 33 is coupled to the mounting part 37 on the bottom surface of the frame 31 by vacuum attraction force via the sealing member 34 while being aligned to a predetermined position.

In this state, the wafer W is extracted from the FOUP 17 of the wafer loading/unloading port 16a by the transfer mechanism 19 and placed on the chuck top 36 supported by the aligner 22 corresponding to a predetermined inspection apparatus 30. At this time, the chuck top 36 is positioned in the alignment area 61, and the position alignment is performed by capturing an image of the wafer W placed thereon with the upper camera 24. Next, the chuck top 36 is moved to the contact area 62 together with the Y block 44 of the aligner 22. At this time, the horizontal position alignment of the wafer W in the contact area 62 is performed by capturing an image of the probe card 33 with the lower camera 46. Next, the chuck top 36 is raised using the Z block 45 of the aligner 22 in the contact area 62 to bring the wafer W into contact with the probes 33a of the probe card 33. At the same time, the chuck top 36 is coupled to the frame 31 by vacuum attraction force via the bellows 35. In this state, the electrical characteristics of the wafer W are tested by the tester 32.

Then, the Z block 45 of the aligner 22 is lowered, and the X block 42 of the aligner 22 is moved to a different inspection apparatus 30 where the testing of the electrical characteristics is completed. In the different inspection apparatus 30 that is a moving destination, the Z block 45 of the aligner 22 is raised in the contact area 62 to support the chuck top 36 on which the tested wafer W is placed. At the same time, the vacuum-attraction of the chuck top 36 is released, and the Z block 45 that is supporting the chuck top 36 is lowered. In this state, the chuck top 36 is moved to the alignment area 61 by the Y block 44 of the aligner 22, and the wafer W on the chuck top 36 is returned to the FOUP 17 of the wafer loading/unloading port 16a by the transfer mechanism 19.

These operations are simultaneously and consecutively performed on the wafers W accommodated in the FOUP 17.

<Operation at the Time of Maintenance (at the Time of Assuring Contact Accuracy)>

The inspection apparatus 30 is subjected to maintenance after a predetermined number of inspections is performed, or when necessary. The maintenance for the inspection apparatuses 30 may be performed individually at predetermined timings or collectively for all the inspection devices 30. In the case of individually performed maintenance, the inspection apparatuses 30 other than the inspection apparatus 30 that is being subjected to the maintenance can perform normal inspection operations.

During the maintenance of the inspection apparatus 30, the probe card 33 coupled to the mounting part 37 on the bottom surface of the frame 31 is removed by releasing the vacuum-attraction and transferred to the probe card loader 16c by the transfer mechanism 19. Further, the position checking member 52 is transferred from the position checking member loader 16d to the mounting part 37 by the transfer mechanism 19 and coupled to the mounting part 37 while being aligned to a predetermined position. Then, the reference wafer 51 is transferred onto the chuck top 36 in the alignment area 61 by the transfer mechanism 19 and attracted and held thereon.

The coordinate system of the reference wafer 51 is obtained by capturing images of the first marks 73 with the upper camera 24 in the alignment area 61. Further, the coordinate system of the position checking member 52 is obtained by capturing images of the second marks 74 with the lower camera 46. The position-alignment is performed by making the coordinate system of the reference wafer 51 and the coordinate system of the position checking member 52 coincide with each other under the control of the controller 50.

Since, however, the alignment area and the contact area are provided in different locations, the contact portions between the electrode pads of the wafer and the probes of the probe card may be misaligned due to, e.g., the accuracy of the driving system (X, Y, Z, and θ directions), the influence of distortion, temperature changes, or the like. Therefore, it is necessary to assure contact accuracy.

Conventionally, as in Patent Document 1, contact accuracy is assured by PMI that brings the probes into contact with the electrode pads.

Since, however, the reference wafer used for performing PMI is used only once, the reference wafer that is an alignment substrate is consumed whenever the maintenance is performed, which results in an increase in running cost.

On the other hand, in the present embodiment, contact accuracy of the inspection apparatus 30 is assured in a non-contact manner without using the probe card.

The method of the present embodiment will be described in detail below.

After the reference wafer 51 is position-aligned on the chuck top 36 in the alignment area 61, the chuck top 36 is moved to the contact area 62 by the aligner 22. Then, the reference wafer 51 is position-aligned to a predetermined horizontal position. Then, the image of the position checking member 52 and the image of the reference wafer 51 disposed therebelow are captured with the position checking camera 71 of the camera unit 70 to check the deviation between the second marks 74 of the position checking member 52 and the first marks 73 of the reference wafer 51. The horizontal position of the reference wafer 51 and the horizontal position of the position checking member 52 in the contact area 62 are obtained in advance by the upper camera 24 and the lower camera 46.

Figure 11:
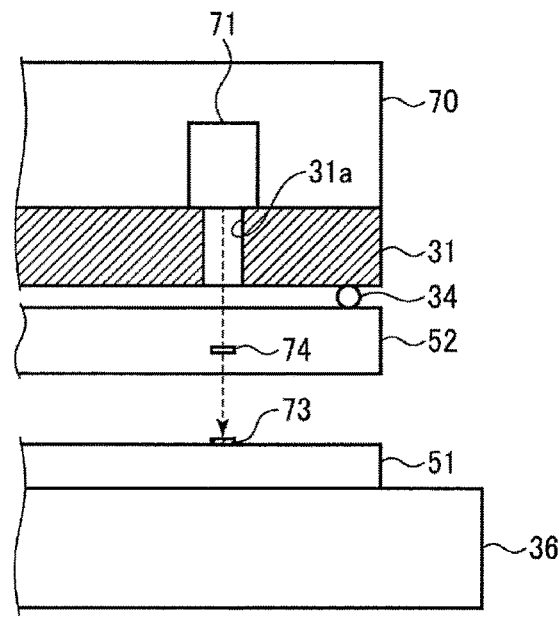
FIG. 11 is a cross-sectional view showing a state of the inspection apparatus at the time of assuring contact accuracy.

In the case of assuring contact accuracy, the reference wafer 51 in the contact area 62 is raised to a reference position by the Z block 45 of the aligner 22, as shown in FIG. 11. Then, the image of the second marks 74 of the position checking member 52 and the image of the first marks 73 of the reference wafer 51 are captured by the position checking camera 71 that captures an image from the top down angle. The height position of the reference wafer 51 at this time is close to, e.g., the height position where the probes 33a of the probe card 33 and the wafer W are brought into contact each other. The position checking camera 71 is configured to focus on both of the second mark 74 of the position checking member 52 and the first mark 73 of the reference wafer 51 in the reference position in the state shown in FIG. 11.

Figure 12:
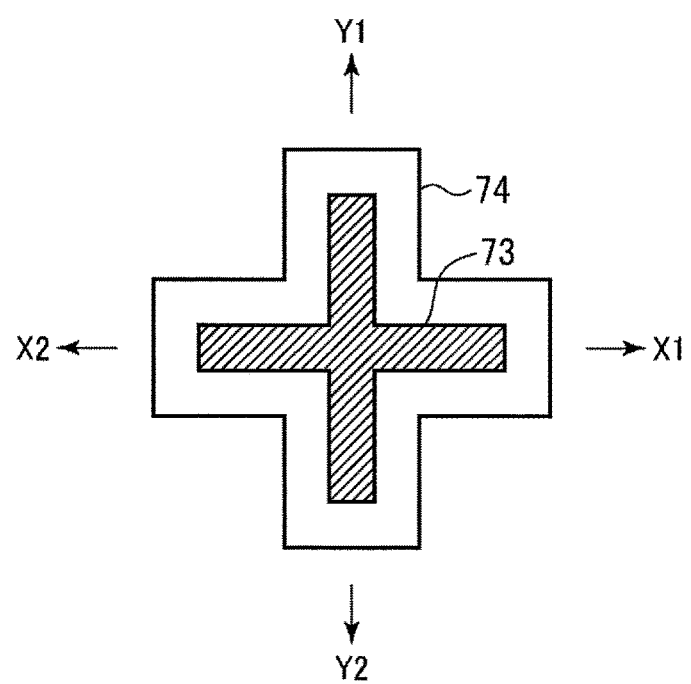
FIG. 12 is an enlarged view of an image taken by a position checking camera 71 and shows a master image in which there is no deviation between a first mark and a second mark.

FIG. 12 is an enlarged view of an image captured by the position checking camera 71. This image is displayed on the display device 93 of the controller 50. In FIG. 12, a white cross indicates the second mark 74 of the position checking member 52 and a black cross indicates the first mark 73 of the reference wafer 51. FIG. 12 shows a master image in a state where there is no deviation therebetween. However, the shapes of the first mark 73 and the second mark 74 are not limited thereto.

Figure 13A:
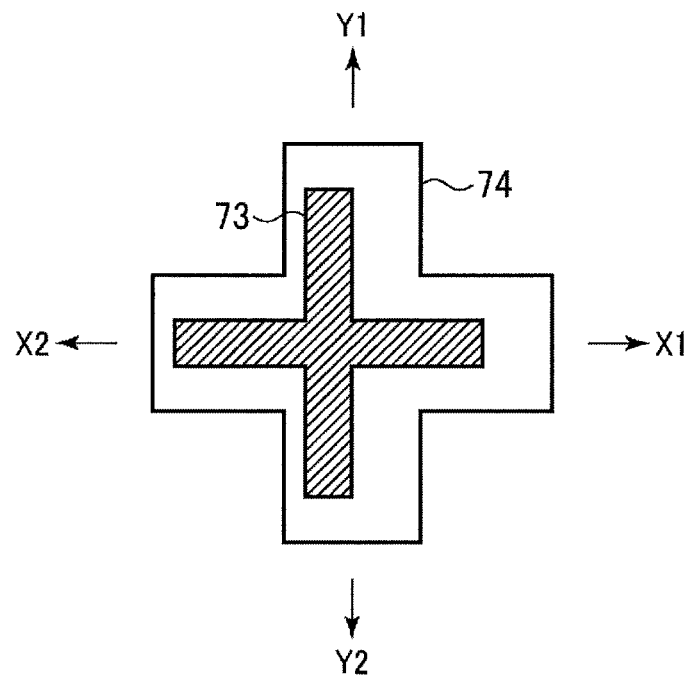
FIG. 13A shows a case where the deviation between the first mark and the second mark is within an allowable range.
Figure 13B:
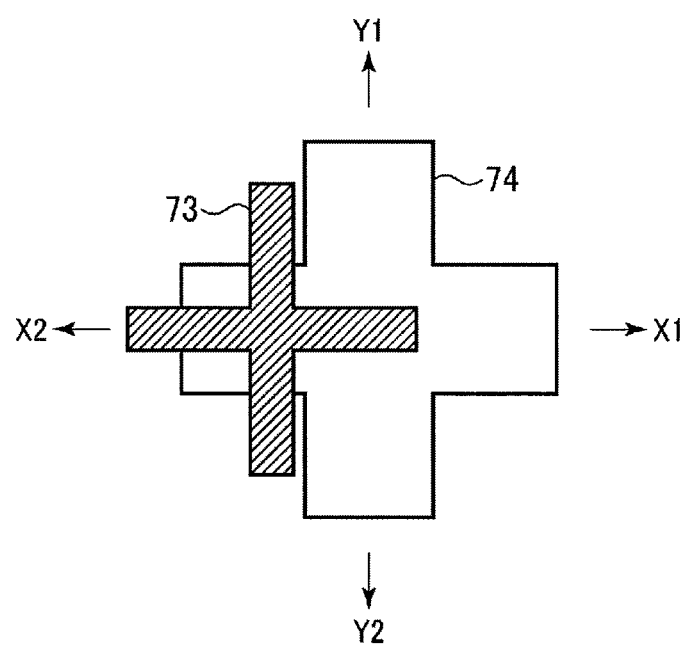
FIG. 13B shows a case where the deviation between the first mark and the second mark is not within the allowable range.

From the master image, the deviation of the first mark 73 in the X direction and the Y direction (X1, X2, Y1, and Y2 in FIG. 12) that are horizontal directions is checked. For example, as long as the first mark 73 is positioned within the white second mark 74, the deviation is determined to be within the allowable range and contact accuracy is assured although the first mark 73 is deviated as shown in FIG. 13A. On the other hand, when at least a part of the first mark 73 is positioned outside the region of the white second mark 74 as shown in FIG. 13B, contact accuracy is not assured. Here, the determination of whether or not the deviation is within the allowable range is performed by the determination unit 96 of the controller 50 or an operator.

Figure 14:
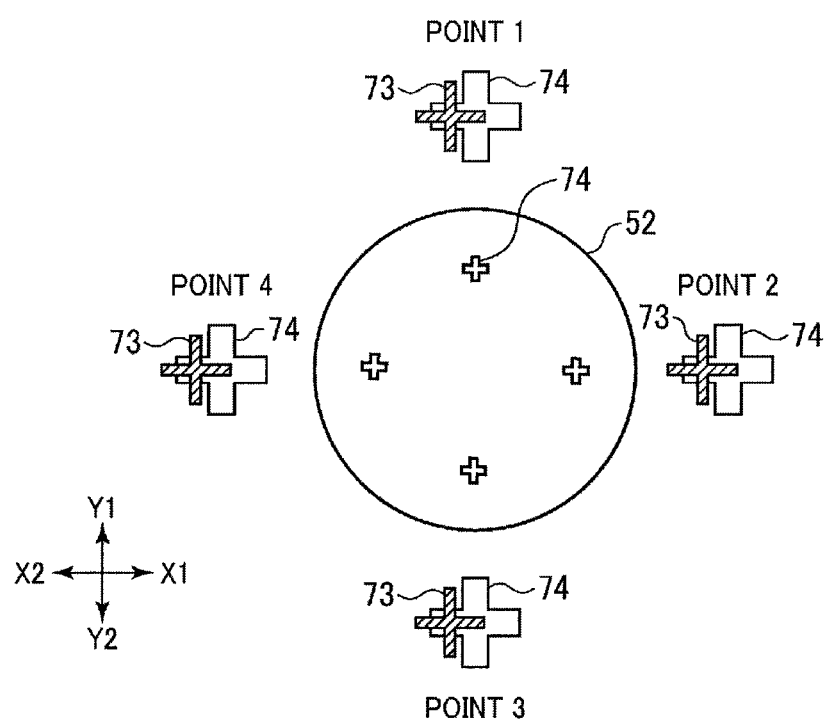
FIG. 14 shows a case where image capturing points (POINT 1 to POINT 4) of four cameras are deviated toward an X direction (X2 side).

The deviation direction and the deviation amount can be calculated by checking the deviation in the X direction and the Y direction compared with the master image by using the four position checking cameras 71. FIG. 14 shows a case where image capturing points (POINT 1 to POINT 4) of the four position checking cameras are deviated toward the X direction (X2 side).

When at least part of the first mark 73 is positioned outside the second mark 74 and, thus, contact accuracy is not assured, the controller 50 performs the operation of contact accuracy assurance after the position-alignment of the reference wafer 51 and the position checking member 52 is performed by correcting the position data stored in the controller 50. Further, contact accuracy may be assured by causing the controller 50 to correct the position data stored therein based on the deviation direction and the deviation amount without performing the operation of contact accuracy assurance again.

As described above, in the present embodiment, at the time of the maintenance, the reference wafer 51 having the plurality of first marks 73 is placed on the chuck top 36. Next, the position checking member 52 that is a transparent body such as glass simulating the probe card and has the plurality of second marks 74 formed at positions corresponding to the first marks 73 of the reference wafer is coupled to the mounting part 37 of the frame 31 to which the probe card 33 is to be coupled. Next, the aligned reference wafer 51 is moved to the contact area directly below the mounting part 37, and the horizontal deviation between the second marks 74 of the position checking member and the first marks 73 of the reference wafer 51 is checked by the position checking cameras 71. When the deviation is within the allowable range, the contact accuracy between the wafer W and the probe 33a of the probe card 33 is assured. Therefore, contact accuracy can be assured in a non-contact manner by image recognition without performing PMI. Accordingly, the reference wafer used for assuring contact accuracy is not consumed, and the operation cost can be reduced.

Further, since the conventional PMI is performed by bringing the probes into contact with the reference wafer in a state where the probe card is coupled, there are variable defects such as damage of the probe card, deterioration of the contact accuracy of the probe card, and the like. However, in the present embodiment, contact accuracy is assured only by the image recognition using the position checking member 52 and the position checking cameras 71 without using the probe card, so that there are no variable defects and high-precision positioning accuracy can be consistently assured.

<Other Applications>

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above-described embodiments, the present disclosure is applied to individual inspection apparatuses in an inspection system having a plurality of inspection units. However, the present disclosure is not limited thereto and may be applied to a single inspection apparatus.

Further, in the above-described embodiments, the reference wafer dedicated for alignment is used as the alignment substrate. However, a typical wafer may be used as the alignment substrate.

DESCRIPTION OF REFERENCE NUMERALS

10: inspection system
22: aligner
30: inspection apparatus
31: frame
33: probe card
36: chuck top
37: mounting part
50: controller
51: reference wafer
52: position checking member
70: camera unit
71: position checking camera
73, 74: mark
80: contact accuracy assurance mechanism
W: wafer (substrate)

The invention claimed is:

1. A method for contact accuracy assurance in an inspection apparatus in which an inspection on a substrate that is an inspection target placed on a stage is performed with a tester by bringing the substrate into contact with a plurality of probes of a probe card, the method comprising:
placing, on the stage, an alignment substrate having a plurality of first marks for position-alignment;
aligning the alignment substrate on the stage;
coupling a position checking member to a predetermined position of a mounting part where the probe card is to be coupled, the position checking member being a transparent body simulating the probe card and having a plurality of second marks for position-alignment at positions corresponding to the first marks of the alignment substrate;
placing the alignment substrate at a predetermined position in a contact area directly below the position checking member;
detecting horizontal deviations between the first marks and the second marks by capturing images of the first marks and the second marks with position checking cameras provided above the position checking member at positions respectively corresponding to the second marks to capture the images from a top down angle; and
assuring contact accuracy between the substrate and the probes of the probe card when the deviations are within an allowable range,
wherein the stage is moved between a contact area where the substrate and the probes of the probe card are brought into contact with each other and an alignment area where the substrate is aligned, the alignment area being spaced apart from the contact area, and
the contact accuracy is assured in a state where the alignment substrate is aligned on the stage in the alignment area and, then, the stage is moved to the contact area and the alignment substrate is aligned to a predetermined position in the contact area,
wherein said detecting the horizontal deviations includes:
obtaining a coordinate system of the alignment substrate by detecting the first marks of the alignment substrate in the alignment area;
obtaining a coordinate system of the position checking member by detecting the second marks of the position checking member;
aligning the alignment substrate and the position checking member so that the coordinate system of the alignment substrate and the coordinate system of the position checking member coincide with each other; and
detecting the horizontal deviations between the second marks and the first marks.

2. The method of claim 1, wherein the alignment substrate is configured as an alignment jig.

3. The method of claim 1, further comprising:
correcting position data of the alignment substrate and/or the position checking member when the horizontal deviations between the second marks and the first marks are not within the allowable range in said detecting the horizontal deviations,
wherein the contact accuracy is assured after the position data is corrected.

4. An inspection apparatus for inspecting a substrate that is an inspection target placed on a stage with a tester by bringing the substrate into contact with a plurality of probes of a probe card, the inspection apparatus comprising:
a frame having a mounting part to which the probe card having the plurality of probes or a position checking member that is a transparent body simulating the probe card is coupled;
the stage on which the substrate that is the inspection target or an alignment substrate is to be placed;
an aligner configured to move the stage;
a transfer mechanism configured to transfer the substrate or the alignment substrate onto the stage or transfer the probe card or the position checking member to the mounting part;
a plurality of position checking cameras provided above the frame to capture images from a top down angle; and
a controller configured to control the aligner, the transfer mechanism, and the position checking cameras,
wherein the alignment substrate has a plurality of first marks for position-alignment,
the position checking member has a plurality of second marks for position-alignment at positions corresponding to the first marks of the alignment substrate,
the position checking cameras are provided above the position checking member at positions respectively corresponding to the second marks, and
the controller detects horizontal deviations between the second marks and the first marks by capturing images of the second marks and the first marks with the position checking cameras in a state where the alignment substrate is placed on the stage and, then, placed at a predetermined position in a contact area directly below the position checking member, and assures contact accuracy between the substrate and the probes of the probe card when the horizontal deviations are within an allowable range,
wherein the aligner moves the stage between the contact area where the substrate and the probes of the probe card are brought into contact with each other and an alignment area where the substrate is aligned, the alignment area being spaced apart from the contact area, and
the controller detects the horizontal deviations between the second marks and the first marks by capturing the images of the second marks and the first marks with the position checking cameras in a state where the alignment substrate is aligned on the stage in the alignment area and, then, the stage is moved to the contact area and the alignment substrate is aligned to a predetermined position in the contact area, wherein the controller detects the horizontal deviations between the second marks and the first marks by obtaining a coordinate system of the alignment substrate by detecting the first marks of the alignment substrate in the alignment area, obtaining a coordinate system of the position checking member by detecting the second marks of the position checking member, aligning the alignment substrate and the position checking member so that the coordinate system of the alignment substrate and the coordinate system of the position checking member coincide with each other, and then capturing the images of the second marks and the first marks with the position checking cameras.

5. The inspection apparatus of claim 4, wherein the controller assures the contact accuracy by correcting position data of the alignment substrate and/or the position checking member when the horizontal deviations between the second marks and the first marks are not within the allowable range.

* * * * *